(12) United States Patent
Strang (10) Patent No.: US 7,540,305 B2
(45) Date of Patent: Jun. 2, 2009

(54) CHEMICAL PROCESSING SYSTEM AND METHOD

(75) Inventor: Eric Strang, Chandler, AZ (US)

(73) Assignee: Tokyo Electron Limited (JP)

( * ) Notice: Subject to any disclaimer, the term of this patent is extended or adjusted under 35 U.S.C. 154(b) by 355 days.

(21) Appl. No.: 11/201,109

(22) Filed: Aug. 11, 2005

(65) Prior Publication Data

US 2005/0270895 A1 Dec. 8, 2005

Related U.S. Application Data

(63) Continuation of application No. PCT/US2004/001423, filed on Jan. 21, 2004.

(60) Provisional application No. 60/447,326, filed on Feb. 14, 2003.

(51) Int. Cl.
*B01F 5/06* (2006.01)
(52) U.S. Cl. .................. 137/896; 366/107; 366/340
(58) Field of Classification Search .......... 137/896, 137/897, 898, 1; 366/107, 152.1, 181.5, 366/183.2, 340, 133.2
See application file for complete search history.

(56) References Cited

U.S. PATENT DOCUMENTS

| | | | | |
|---|---|---|---|---|
| 4,068,830 A | * | 1/1978 | Gray ................... | 366/175.2 |
| 4,092,013 A | * | 5/1978 | Staaf .................. | 366/165.4 |
| 4,521,117 A | | 6/1985 | Ouwerkerk et al. | |
| 5,441,703 A | | 8/1995 | Jurgensen | |
| 6,126,744 A | * | 10/2000 | Hawkins et al. ....... | 117/85 |
| 6,143,079 A | * | 11/2000 | Halpin ................ | 118/715 |
| 6,303,501 B1 | | 10/2001 | Chen et al. | |

FOREIGN PATENT DOCUMENTS

| | | |
|---|---|---|
| GB | 113032 | 2/1918 |
| WO | WO 02/071464 A1 | 9/2002 |
| WO | WO 02/079082 A2 | 10/2002 |

* cited by examiner

*Primary Examiner*—Stephen M Hepperle (57) ABSTRACT

A chemical processing system includes a mixing chamber coupled to the chemical processing system. A stream of first process gas and a stream of second process gas are introduced into the mixing chamber. The stream of first process gas and the stream of second process gas interact with each other to form a mixed process gas, which is supplied to the substrate for processing thereof. A method of mixing process gas in a mixing chamber of a chemical processing system is provided. The method includes injecting a stream of first process gas and a stream of second process gas into the mixing chamber, causing the streams of the first process gas and the second process gas to interact and mixing the first process gas and the second process gas in the mixing chamber to form a mixed process gas. A mixing system is also provided.

9 Claims, 8 Drawing Sheets

CHEMICAL PROCESSING SYSTEM AND METHOD

This is Continuation Application of International Application No. PCT/US2004/001423, filed on Jan. 21, 2004, which is based upon and derives the benefit of U.S. Provisional Patent Application No. 60/447,326, filed Feb. 14, 2003, the entire contents of both of which are incorporated herein by reference in their entireties.

BACKGROUND OF THE INVENTION

1. Field of Invention

The present invention relates to chemical processing and more particularly to mixing process gases used in chemical processing, e.g., chemical oxide removal (COR) processing.

2. Description of Background Information

Chemical oxide removal (COR) processing can be used to form or process a mask in an oxide layer which can be used to etch a substrate with feature dimensions, e.g., around 100 nanometers or less. Such chemical oxide removal (COR) processes can include exposing surfaces of the oxide layer to process gases, and heat treating the chemically treated oxide surface layer.

SUMMARY OF THE INVENTION

One aspect of embodiments of the invention is to provide a chemical processing system. The chemical processing system comprises a supply of first process gas and a supply of second process gas. A mixing chamber is configured to mix at least the first process gas and the second process gas therein. A gas injection system is configured to inject the first and second process gases into the mixing chamber, such that the first process gas interacts with the second process gas in the mixing chamber. A processing chamber containing a chemical processing region is positioned in communication with the mixing chamber. A substrate to be processed with the mixed process gas can be positioned within the processing chamber.

Another aspect of embodiments of the invention is to provide a method of mixing process gas in a mixing chamber of a chemical processing system. The method comprises injecting a supply of first process gas into the mixing chamber and injecting a supply of second process gas into the mixing chamber. The first process gas is impinged on the second process gas and the first process gas and the second process gas are mixed in the mixing chamber to form a mixed process gas.

Yet another aspect of embodiments of the invention is to provide a mixing system for use with a chemical processing system. The mixing system comprises a mixing chamber coupled to the chemical processing system. A first process gas can be supplied into the mixing chamber and a second process gas can be supplied into the mixing chamber. The first process gas can be impinged on the second process gas within the region. The first process gas and the second process gas can be mixed in the mixing chamber to form a mixed process gas, which can be supplied to the substrate during processing of the substrate.

BRIEF DESCRIPTION OF THE DRAWINGS

The accompanying drawings, which are incorporated in and constitute a part of the specification, of embodiments of the invention, together with the general description given above and the detailed description of the embodiments given below, serve to explain the principles of the invention wherein.

DETAILED DESCRIPTION OF EMBODIMENTS

Figure 1:
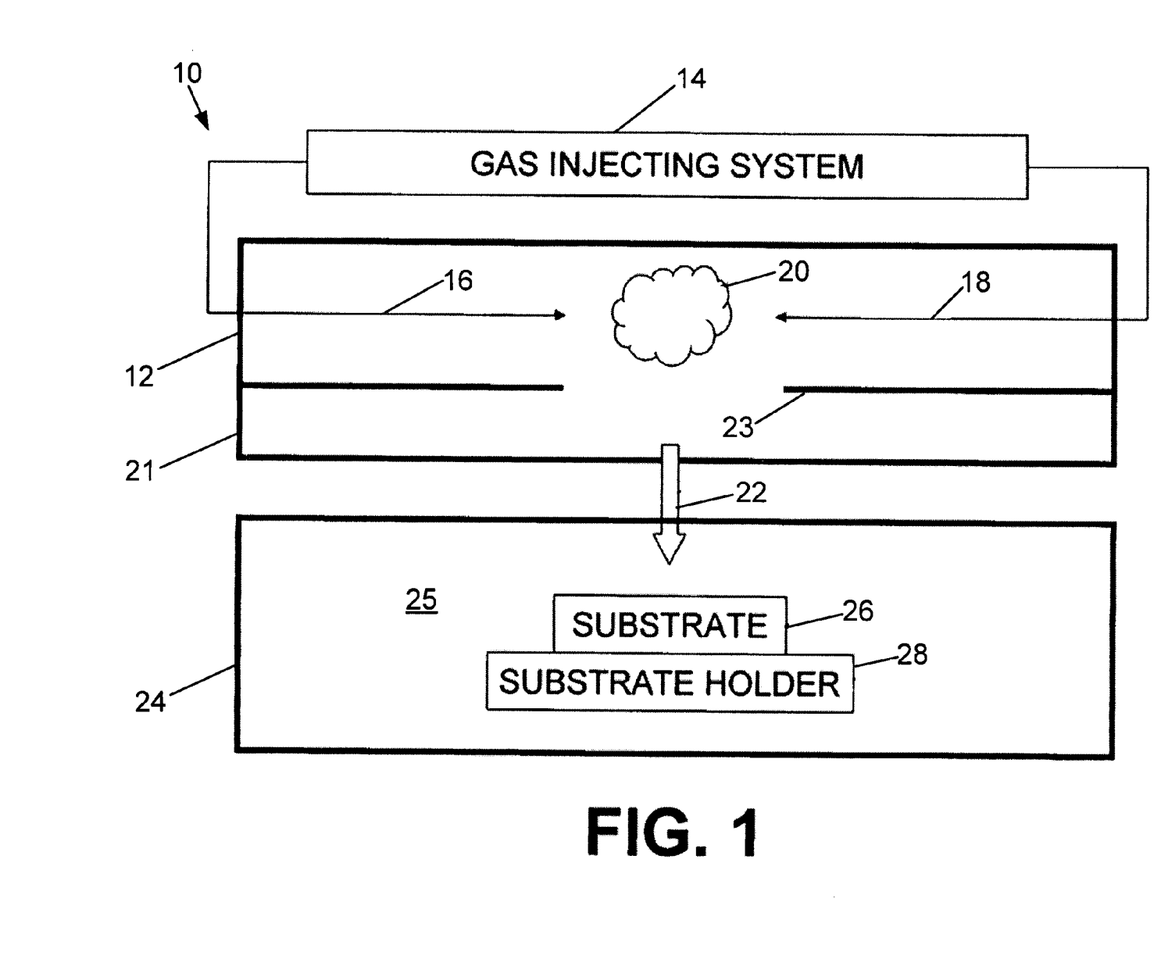
FIG. 1 is a schematic view of a chemical processing system in accordance with the principles of the invention, showing a mixing chamber coupled to a gas injecting system and a processing chamber.
Figure 2:
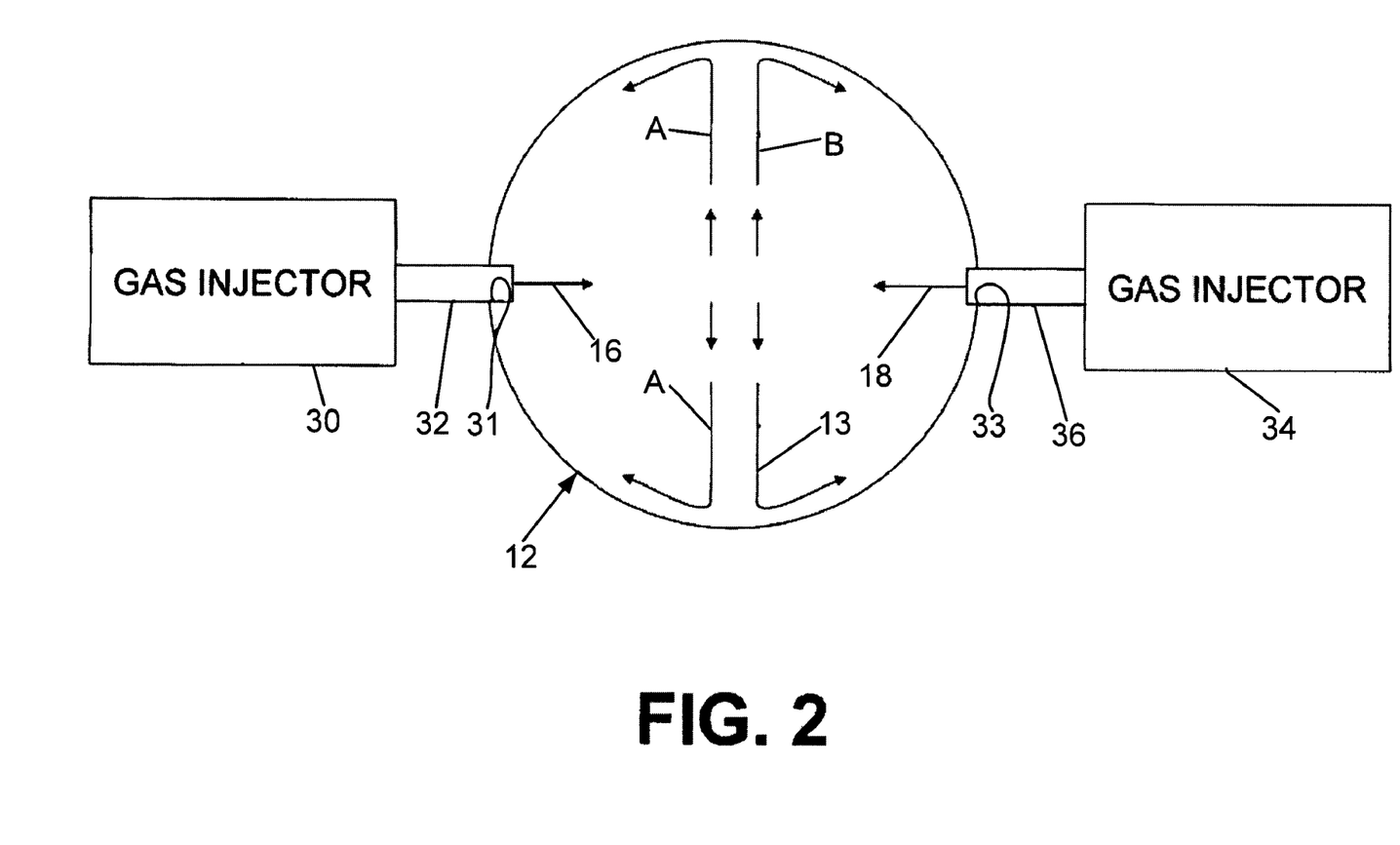
FIG. 2 is a schematic view of the mixing chamber and a gas injecting system shown in FIG. 1 in accordance with the principles of the invention, showing a stream of first process gas in line with a stream of a second process gas.

FIGS. 1 and 2 show an embodiment of a chemical processing system according to principles of the invention. The chemical processing system is illustrated as a chemical oxide removal system, generally indicated at 10, and includes a mixing chamber 12. The mixing chamber 12 can be hermetically sealed and formed from aluminum or another suitable material, such as an anodized material to form a protective layer thereon. A gas injection or injecting system 14 includes a first gas injector 30 (FIG. 2) and a second gas injector 34 (FIG. 2) configured to inject process gas 16, 18 into the mixing chamber 12.

The gas injector 30 is externally coupled to the mixing chamber 12 by a gas supply line 32, which extends through an opening 31 formed in the mixing chamber 12. The gas supply line 32 is configured to carry process gas 16 from the injector 30 to the mixing chamber 12.

Another gas injector 34 is externally coupled to the mixing chamber 12 by a gas supply line 36, which extends through an opening 33 formed in the mixing chamber 12. The gas supply line 36 is configured to carry process gas 18 from the injector 34 to the mixing chamber 12. The process gases 16, 18 can be selected according to the desired application as understood by one skilled in the art and can be hydrogen fluoride or ammonia, for example, although other gases can be used.

Figure 7:
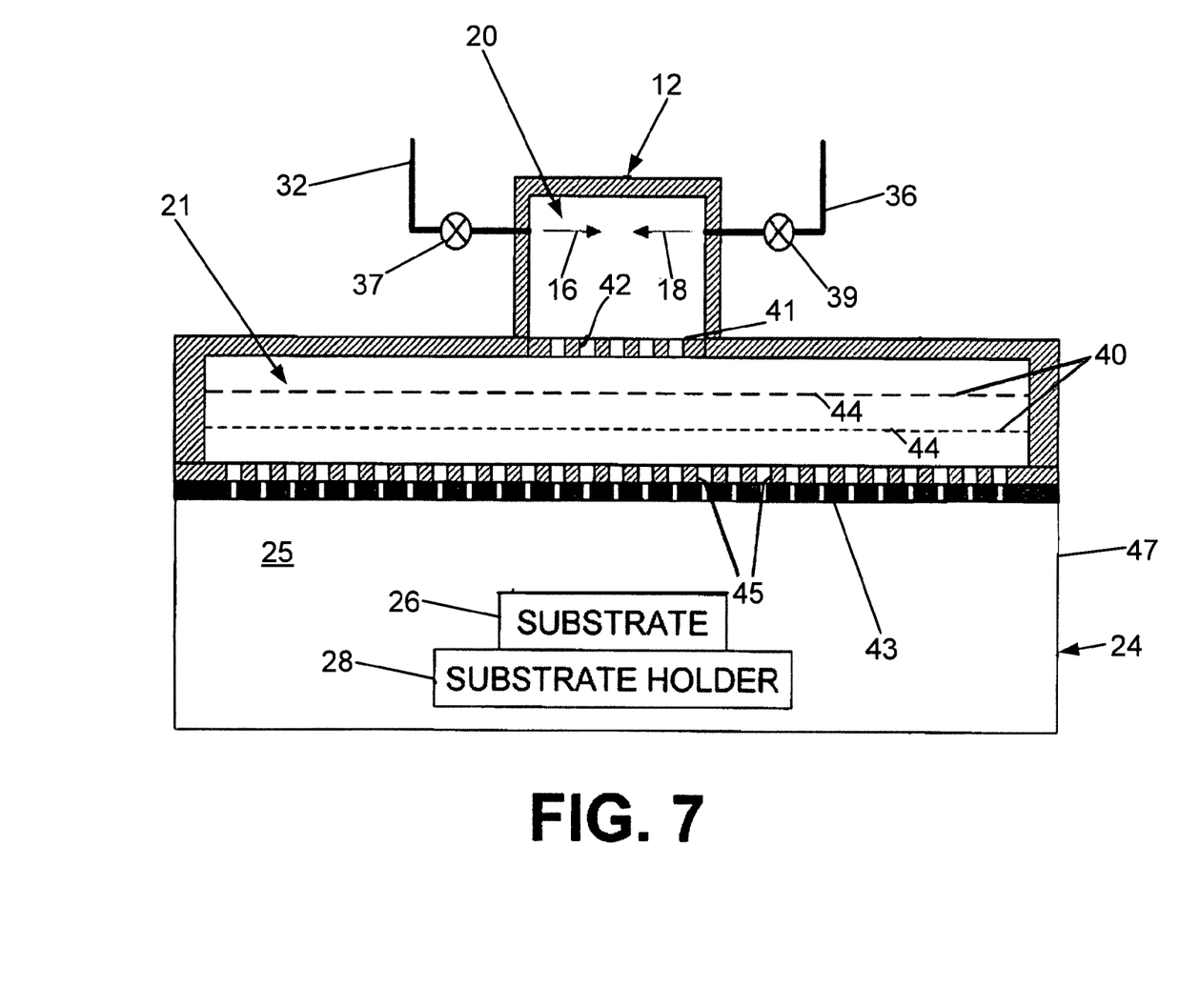
FIG. 7 is a diagrammatic cross section of another mixing chamber and a gas injecting system having a baffle plate coupled to the mixing chamber at one end thereof.

The gas supply lines 32, 36 are shown to be independent from one another and can be made from a stainless steel or other type of rigid metal. The gas supply lines 32, 36 can have any size inner or outer diameter, for example, an inner diameter of 0.25 inches or an outer diameter of 1 inch. The gas supply lines 32, 36 can be double walled or made of sufficiently thick material. To control gas flow therethrough, each gas supply line 32, 36 can include a mass flow controller or pressure regulator in line therewith (FIG. 7).

In a mixing region 20 of the mixing chamber 12, the first and second process gases 16, 18, respectively, are mixed. A gas distribution plenum 21 can be positioned in communication with the mixing chamber 12 through one or more openings 23, for example, to facilitate further mixing of the process gases 16, 18 prior to the gases 16, 18 being supplied to a processing chamber 24.

Arrow 22, in FIG. 1, is representative of mixed process gas, which can be supplied to the processing chamber 24 from the mixing chamber 12 and the gas distribution plenum 21. The processing chamber 24 contains a chemical processing region 25, in which a substrate 26 can be positioned within the chemical processing region 25 to be processed, e.g., on a movable or non-movable substrate holder 28. The substrate 26 can be a semiconductor wafer, and can include an oxide layer to be patterned as a mask to be used to form a gate electrode feature. The oxide layer can be patterned by removing the desired portions of oxide through a chemical process and a heating process, for example.

Although not shown in FIG. 1, the processing chamber 24 can be coupled to a heat treatment chamber for heat treating the substrate 26. Alternatively, the heat treatment chamber can be any temperature controlled chamber capable of treating the substrate 26, e.g., to remove chemically treated oxide surface layers therefrom. For example, both the chemical processing and heat treatment can occur in the processing chamber 24. Although not shown, one or more vacuum pumping systems can be coupled to the processing chamber 24 to provide a desired processing pressure within the processing chamber 24, for example.

In the embodiment shown in FIGS. 1 and 2, the gas supply lines 32, 36 are positioned so that the stream of process gas 16 and the stream of process gas 18 can intersect. For example, streams of process gases 16, 18 leave the injectors 30 and 34 in line (in a plane parallel to walls of the mixing chamber 12) and from opposite directions. As the process gases 16, 18 are injected into the mixing chamber 12, the respective streams of process gases 16, 18 can essentially meet one another in the mixing chamber 12 (shown as mixing region 20 in FIG. 1). From the mixing region 20, the mixing gases follow flow paths, which are indicated by the arrows A and B (FIG. 2). The flow paths A and B facilitate further mixing of the process gases 16, 18 and generally represent one example of counter-jet impingement mixing. Such counter-jet impingement mixing can be used to mix the process gases 16, 18 when the process gases 16, 18 are injected into the mixing chamber 12 under high pressure until molecular diffusion can complete the mixing and, in turn, reduce the mixing length or time it takes for the process gases 16, 18 to mix together.

Figure 3:
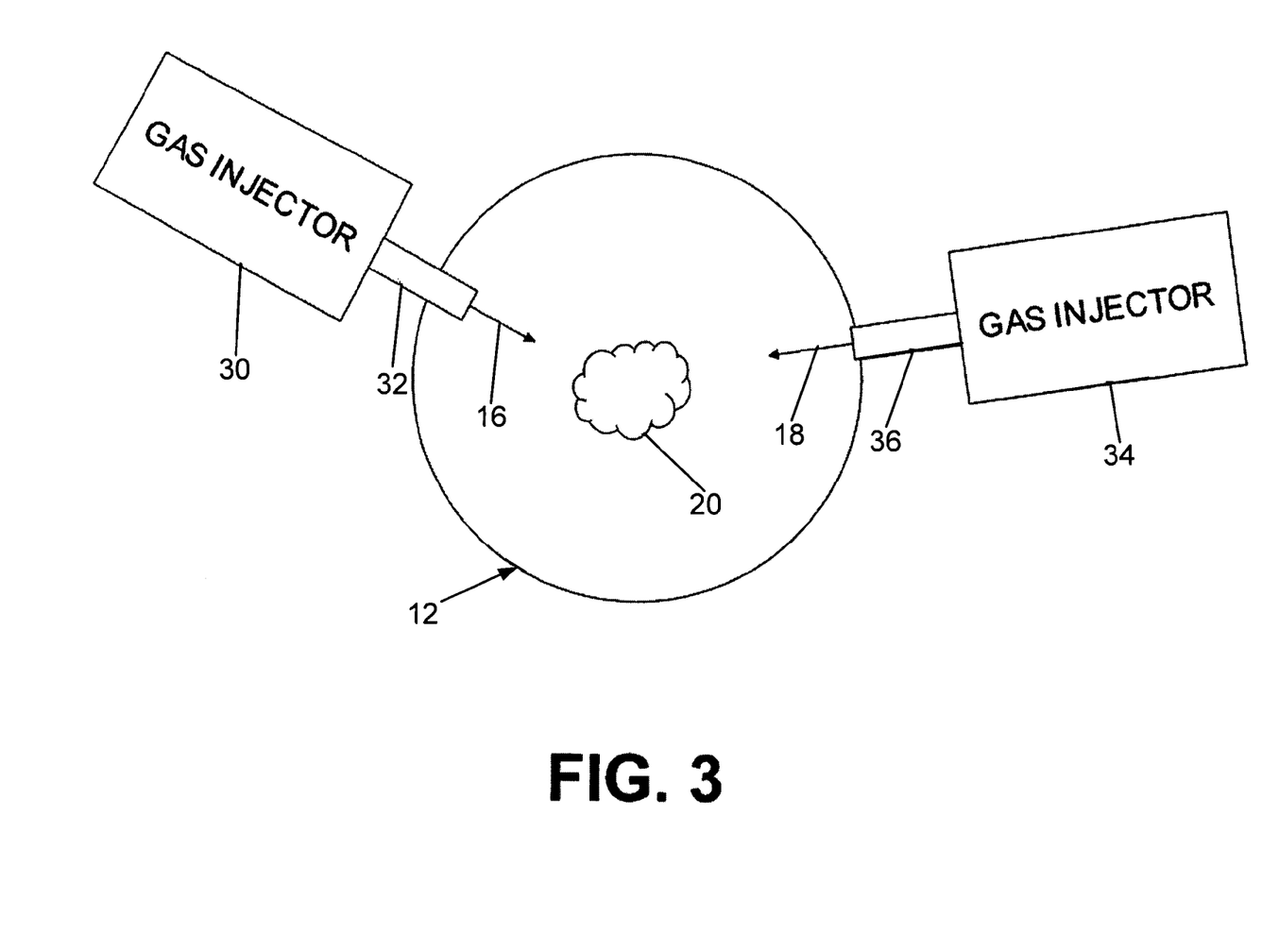
FIG. 3 is a schematic view of an alternative mixing chamber in accordance with the principles of the invention, showing a stream of first process gas angled with respect to a stream of the second process gas in the same plane.
Figure 4:
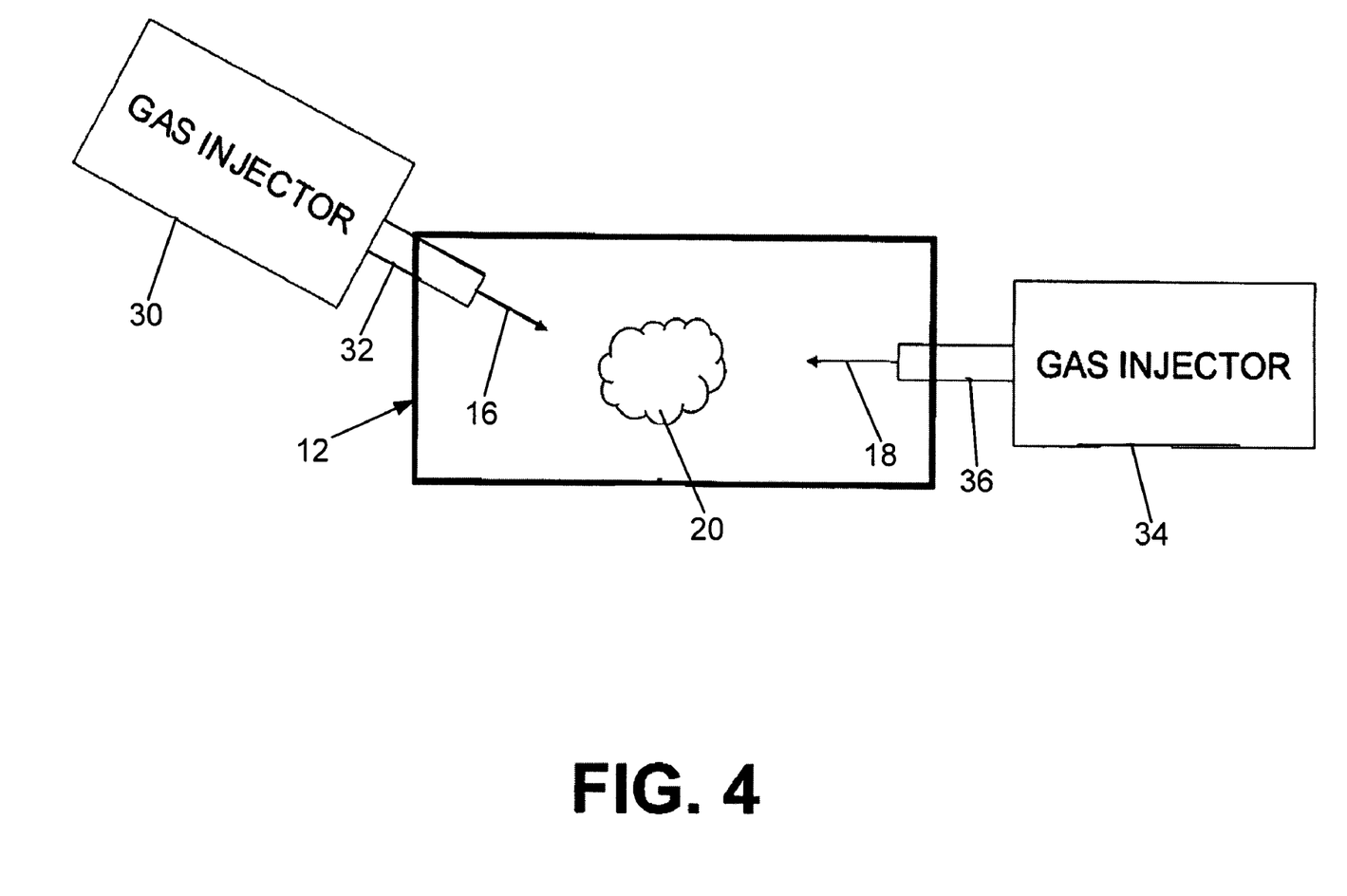
FIG. 4 is a schematic view of an alternative mixing chamber in accordance with the principles of the invention, showing a stream of first process gas angled with respect to a stream of the second process gas in different planes.

FIGS. 3 and 4 show alternative configurations of the injectors 30, 34 for causing the streams of process gases 16, 18 to intersect in the mixing region 20. For example, FIG. 3 shows the injectors 30, 34 positioned such that a stream of first process gas 16 is angled with respect to a stream of the second process gas 18 in a plane parallel to walls of the mixing chamber 12. The injectors 30, 34 can be angled at any angle so that the streams of process gases 16, 18 intersect with one another.

FIG. 4 shows the injectors 30, 34 positioned such that a stream of first process gas 16 is angled with respect to a stream of the second process gas 18 in a plane not parallel to walls of the mixing chamber 12. Either injector 30, 34 can be angled with respect to a plane parallel to walls of the mixing chamber 12 or both injectors 30, 34 can be angled with respect to that plane. The injectors 30, 34 can be angled at any angle so that the streams of process gases 16, 18 intersect with one another.

Figure 5:
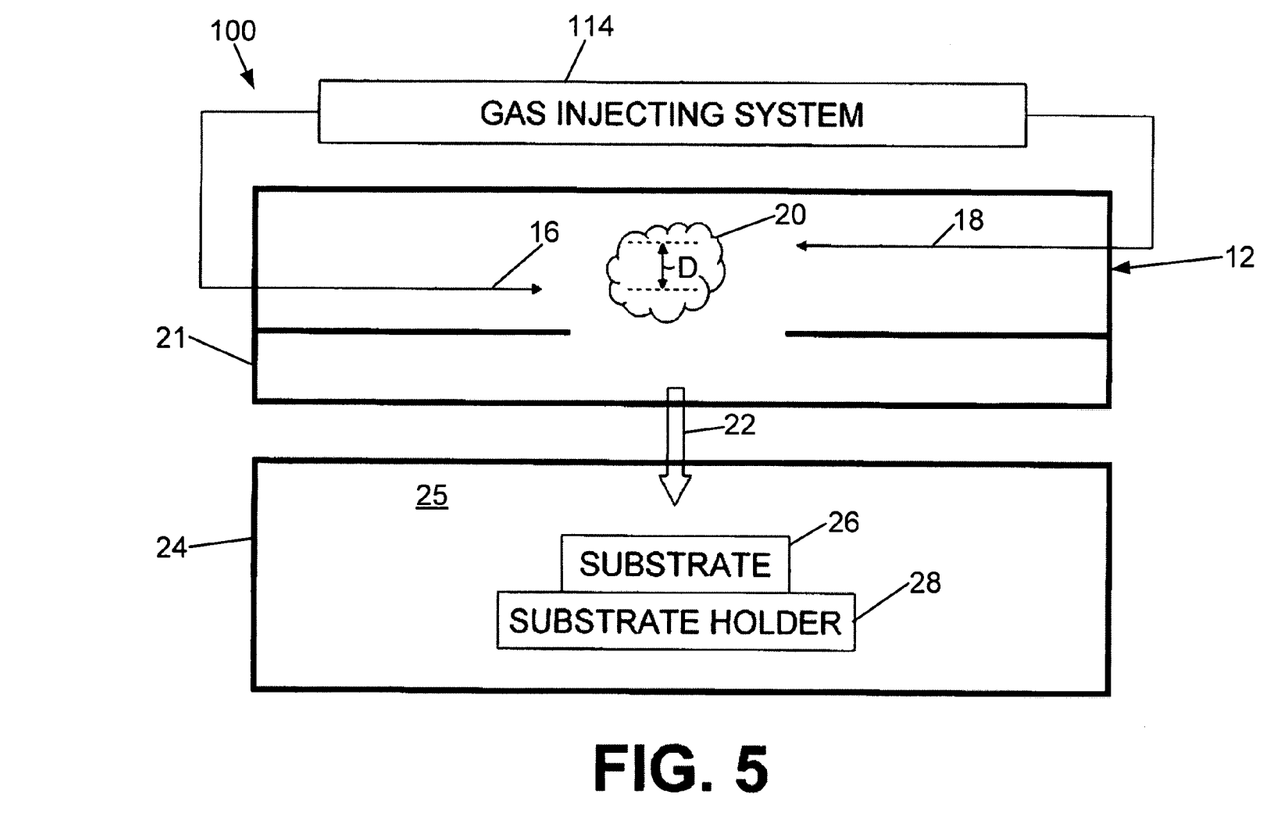
FIG. 5 is a schematic view of another embodiment of a chemical processing system in accordance with the principles of the invention, showing a mixing chamber coupled to a gas injecting system and a processing chamber, wherein a stream of the first process gas passes adjacent to a stream of the second process gas in a first plane.

FIG. 5 shows a chemical processing system 100. The chemical processing system 100 is substantially similar in construction to the chemical processing system 10, but includes a gas injection system 114. The gas injection system 114 is configured to inject streams of the process gases 16, 18 in a plane (a vertical plane in FIG. 5), but offset from one another so that streams of process gases 16, 18 pass adjacent to one another within the mixing region 20 of the mixing chamber 12.

This spaced relationship, which is represented as D in FIG. 5, is caused by the gas supply lines 32, 36 being offset from one another in a vertical plane.

Figure 6:
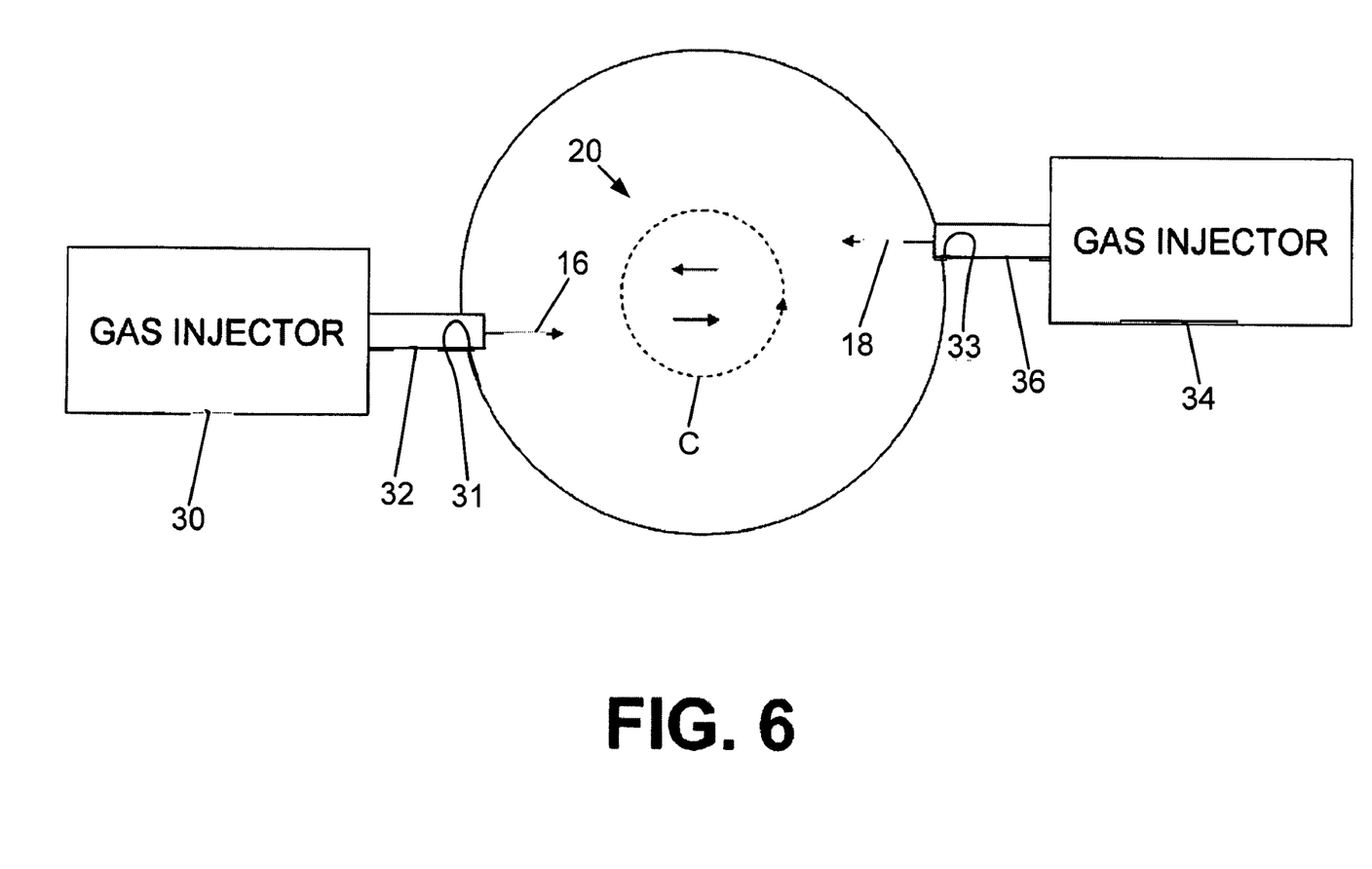
FIG. 6 is a schematic view of another mixing chamber and a gas injecting system in accordance with the principles of the invention, showing a stream of the first process gas passing adjacent to a stream of the second process gas in a second plane.

In the alternative arrangement of FIG. 6, process gases 16, 18 are injected in streams offset from one another in a different plane from FIG. 5 (a horizontal plane). Although the gas supply line 36 is shown positioned rearwardly of the gas supply line 32 in FIG. 6, the positions of the gas supply lines 32, 36 could be reversed in an alternative embodiment, for example.

Shear is induced by the offset relationship between the gas supply lines 32, 36 and a streamwise vorticity is provided in the mixing region 20. The streamwise vorticity is represented by the arrow C (FIG. 6). When injected into the mixing region 20, for example, the streams of process gas 16, 18 can travel in a substantially spiral pattern, which can facilitate further mixing of the streams of process gas 16, 18.

The injectors 30, 34 can be positioned in other configurations so that the streams of process gases 16, 18 pass adjacent to one another in the mixing region 20. For example, the injectors 30, 34 can be positioned such that the streams of process gases 16, 18 are injected in any plane. Either injector 30, 34 can be angled with respect to the other injector 30, 34 or both injectors 30, 34 can be angled with respect to one another.

FIG. 7 shows the chemical processing system 10 shown and described above (in any of the embodiments), but further including an orifice plate 41 positioned between the mixing chamber 12 and the gas distribution plenum 21, one or more baffle members 40 positioned within the gas distribution plenum 21 and a gas distribution plate 43 as one surface of the mixing chamber 12.

As illustrated, gas supply lines 32, 36 can include a mass flow controller or pressure regulator 37, 39 in line therewith to help control gas flow through each supply line 32, 36.

The orifice plate 41, each baffle member 40 and the gas distribution plate 43 each have an elongated configuration and a plurality of openings 42, 44, 45, respectively formed therein. If two or more baffle members 40 are provided in the gas distribution plenum 21, the openings 44 of each baffle member 40 can be spaced equidistant, closer or farther from one another, for example.

As process gas, e.g., process gas 16, 18, passes through the openings 45 of the gas distribution plate 43, the process gas 16, 18 disperses outwardly, into the processing chamber 24. The openings 45 also can redistribute the bulk velocity field toward the substrate 26. The baffle members 40 and the gas distribution plate 43 can be mounted to the gas distribution plenum 21, for example, by fasteners. The fasteners can include screws, nuts and bolts, rivets or other fasteners capable of mounting the baffle member 40 or the gas distribution plate 43 to the gas distribution plenum 21. One or more baffle members 40 can be positioned within the gas distribution plenum 21 or the gas distribution plate 43 can be positioned between the mixing chamber 12 and the processing chamber 24 in any of the embodiments described above.

Optionally, a sacrificial gas distribution plate 47 can be coupled to the gas distribution plate 43 to protect the gas distribution plate 43 from potential damage caused by the process gas. The sacrificial gas distribution plate 47 can comprise silicon, quartz, alumina, sapphire, carbon, silicon nitride, silicon carbide, coated aluminum such as anodized aluminum, spray coated aluminum such as yttrium oxide thermally sprayed coating or tetrafluoroethylene, for example.

Figure 8:
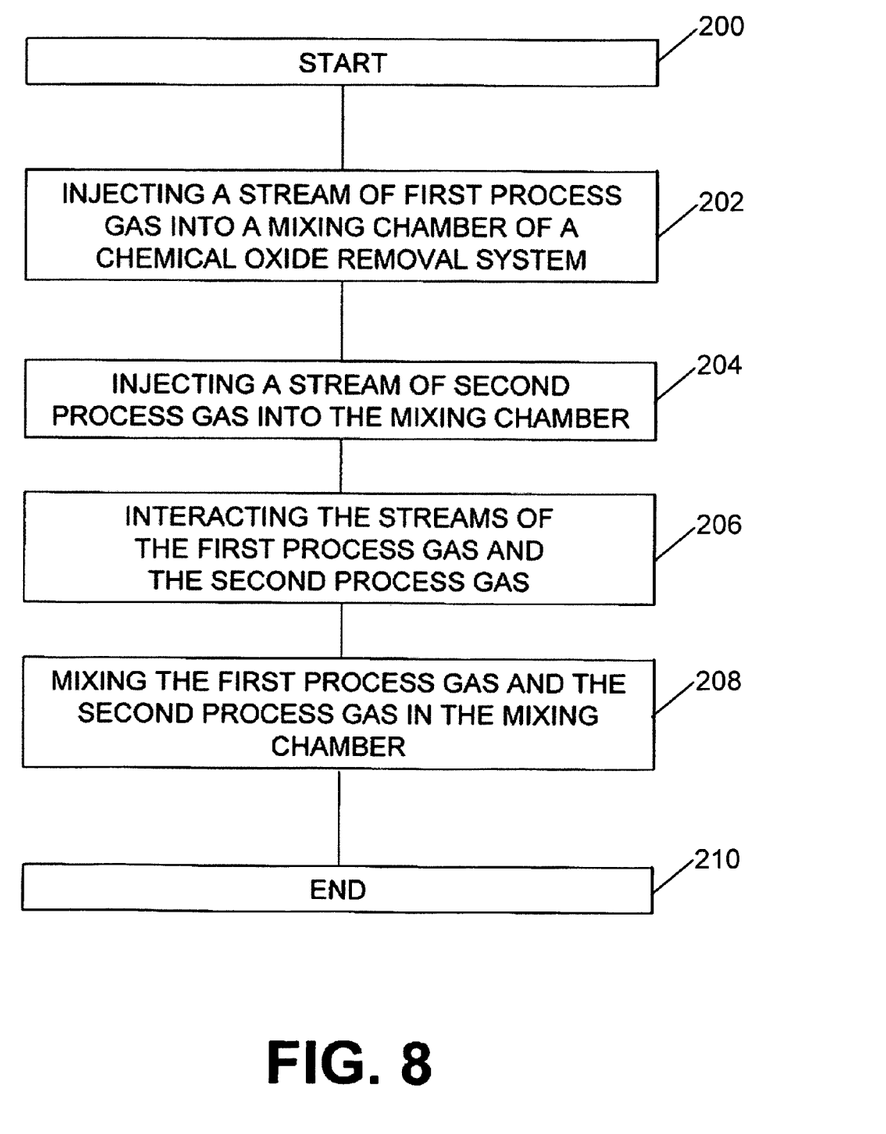
FIG. 8 is a flow chart showing a method of mixing process gases in a chemical processing system in accordance with principles of the invention.

FIG. 8 shows a method in accordance with principles of the invention. The method relates to mixing process gas in a mixing chamber of a chemical processing system, such as a chemical oxide removal system, for example. The method starts at 200. At 202, a stream of first process gas is injected into the mixing chamber. At 204, a stream of second process gas is injected into the mixing chamber. At 206, the first process gas interacts with the second process gas, e.g., to generate a certain flow path or vortex. The gases can behave more diffusive at low pressures. At 208, the first process gas and the second process gas are mixed in the mixing chamber to form a mixed process gas. Although not shown, the mixed process gas can be supplied to the chemical processing system, e.g., to a processing chamber thereof. At 210, the method ends.

Various combinations of these additional acts, operations or procedures could be used as well. For example, the first process gas can impinge on or intersect the second process gas directly or indirectly. Mixed gas can be dispersed, e.g., using a gas distribution plenum, a baffle member or a gas distribution plate described above. The mixing can be performed prior to chemical or heat treatment.

While the present invention has been particularly shown and described with reference to the preferred embodiments thereof, it will be understood by those skilled in the art that various changes in form and details can be made therein without departing from the spirit and scope of the invention.

For example, the gas injection systems described above can be used with any processing system in which there is at least a chemical treatment process in which at least two process gases are injected into a processing chamber. Also, more than two gas injectors can be used, for example, to inject more than two process gases although only two gas injectors are described in the above embodiments.

Thus, the foregoing embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A chemical processing system, comprising:
   a mixing chamber configured to mix at least a stream of first process gas and a stream of second process gas;
   a gas injection system configured to inject the first and second process gases into the mixing chamber, the first process gas interacting with the second process gas in the mixing chamber;
   a processing chamber containing a chemical processing region in communication with the mixing chamber;
   a substrate holder disposed in the processing chamber, to receive a substrate during substrate processing;
   a gas distribution plenum coupled between the mixing chamber and the processing chamber;
   a gas distribution plate coupled to the gas distribution plenum, the gas distribution plate being configured to disperse gas flowing therethrough into the processing chamber;
   an orifice plate coupled between the gas distribution plenum and the mixing chamber; and
   a sacrificial gas distribution plate coupled to the gas distribution plate.

2. A chemical processing system as in claim 1, wherein the stream of the first process gas and the stream of the second process gas intersect after introduction of the first and second process gases into the mixing chamber.

3. A chemical processing system as in claim 1, wherein the stream of the first process gas and the stream of the second process gas pass adjacent to each other after introduction of the first and second process gases into the mixing chamber.

4. A chemical processing system as in claim 1, wherein the gas injection system includes separate gas carrying lines for each process gas to be mixed within the mixing chamber.

5. A chemical processing system as in claim 1, further comprising at least one baffle member positioned within the gas distribution plenum.

6. A chemical processing system as in claim 1, wherein the gas injection system includes a first process gas injector and a second process gas injector, the first process gas injector is configured to inject the first process gas into the mixing chamber and the second process gas injector is configured to inject the second process gas into the mixing chamber.

7. A chemical processing system as in claim 1, wherein the streams of first and second process gases are injected into the mixing chamber in diametrically opposite relation to one another.

8. A chemical processing system as in claim 1, wherein the streams of first and second process gases are injected into the mixing chamber in spaced relation to one another.

9. A chemical processing system as in claim 1, wherein the streams of first and second process gases are injected into the mixing chamber in angled relation to one another.

* * * * *